United States Patent

Tsunedomi et al.

(10) Patent No.: US 10,024,894 B2
(45) Date of Patent: Jul. 17, 2018

(54) POWER SYSTEM ANALYSIS SUPPORT SYSTEM, ANALYSIS SUPPORT APPARATUS FOR POWER SYSTEM, ANALYSIS SUPPORT METHOD FOR POWER SYSTEM, AND MEASURING DEVICE FOR POWER SYSTEM

(71) Applicant: Hitachi, Ltd., Tokyo (JP)

(72) Inventors: Kunihiko Tsunedomi, Tokyo (JP); Masahiro Watanabe, Tokyo (JP); Tsukasa Oonishi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 182 days.

(21) Appl. No.: 15/114,420

(22) PCT Filed: Sep. 22, 2014

(86) PCT No.: PCT/JP2014/074984
§ 371 (c)(1),
(2) Date: Jul. 27, 2016

(87) PCT Pub. No.: WO2015/122042
PCT Pub. Date: Aug. 20, 2015

(65) Prior Publication Data
US 2016/0349296 A1    Dec. 1, 2016

(30) Foreign Application Priority Data
Feb. 14, 2014   (JP) .................................. 2014-026299

(51) Int. Cl.
*G05F 1/14* (2006.01)
*G01R 21/133* (2006.01)
(Continued)

(52) U.S. Cl.
CPC ..... *G01R 21/1331* (2013.01); *G01R 19/2513* (2013.01); *G01R 21/003* (2013.01);
(Continued)

(58) Field of Classification Search
USPC .............. 323/340; 307/31; 370/250; 703/16; 702/62
See application file for complete search history.

(56) References Cited

U.S. PATENT DOCUMENTS

2010/0217550 A1* 8/2010 Crabtree ................. H02J 3/005
                                                              702/62
2011/0178789 A1* 7/2011 Miranda ............. G06F 17/5036
                                                              703/16
(Continued)

FOREIGN PATENT DOCUMENTS

JP   2005-057821 A   3/2005
JP   2010-220283 A   9/2010

OTHER PUBLICATIONS

Extended European Search Report received in corresponding European Application No. 14882538.3 dated Sep. 5, 2017.
(Continued)

*Primary Examiner* — Lam Nguyen
(74) *Attorney, Agent, or Firm* — Mattingly & Malur, PC

(57) ABSTRACT

To provide a power system analysis support system in which the amount of data to be sent from a measuring device to an analysis support apparatus can be reduced. A measuring device includes a measuring unit which performs measurement related to a power system, a storage unit which stores measurement values measured by the measuring unit, a parameter generator which generates a predetermined parameter indicating a probability density function of the measurement value from the plurality of measurement values stored in the storage unit, and a communication unit which sends the predetermined parameter generated by the parameter generator to an analysis support apparatus. The analysis support apparatus includes a communication unit which receives the predetermined parameter from the measuring device, and a probability density function generator
(Continued)

which generates a probability density function of the measurement value from the received predetermined parameter.

10 Claims, 7 Drawing Sheets

(51) Int. Cl.
*G06Q 50/06* (2012.01)
*H02J 13/00* (2006.01)
*G01R 19/25* (2006.01)
*G01R 21/00* (2006.01)

(52) U.S. Cl.
CPC ............ *G06Q 50/06* (2013.01); *H02J 13/001* (2013.01); *H02J 13/0079* (2013.01); *Y04S 10/40* (2013.01)

(56) References Cited

U.S. PATENT DOCUMENTS

| | | | |
|---|---|---|---|
| 2013/0035885 A1 | 2/2013 | Sharon et al. | |
| 2013/0234696 A1 | 9/2013 | Bryson et al. | |
| 2014/0133316 A1* | 5/2014 | Yoshida | H04L 43/0888 370/250 |

OTHER PUBLICATIONS

International Search Report of PCT/JP2014/074984 dated Nov. 4, 2014.

* cited by examiner

POWER SYSTEM ANALYSIS SUPPORT SYSTEM, ANALYSIS SUPPORT APPARATUS FOR POWER SYSTEM, ANALYSIS SUPPORT METHOD FOR POWER SYSTEM, AND MEASURING DEVICE FOR POWER SYSTEM

TECHNICAL FIELD

The present invention relates to a power system analysis support system, an analysis support apparatus for a power system, an analysis support method for a power system, and a measuring device for a power system.

BACKGROUND ART

Technologies for stably operating a power system based on measurement values from a sensor disposed in the power system have been known. In PTL 1, a sensor installed in a distribution system measures a current, a current power factor, active power, reactive power, a node voltage, and the like in a line, and sends information to a device for determining line drop compensator (LDC) parameters.

PTL 2 discloses analysis assisting equipment which calculates probability distribution of the voltage at each node or probability distribution of the current in each line to evaluate whether introduction of a facility in a distribution system is appropriate or not.

CITATION LIST

Patent Literature

PTL 1: JP-A-2010-220283
PTL 2: JP-A-2005-57821

Non-Patent Literature

NPL 1: Written by Mikio Hino, "Spectral Analysis", Asakura Shoten, July 2010, p. 107 and p. 117

SUMMARY OF INVENTION

Technical Problem

In power companies, a current, a voltage, and the like are measured by a measuring device installed on a distribution line, and the measurement values are sent to an analysis support apparatus in order to monitor a state of a power system. As in PTL 2, the analysis support apparatus converts the measurement value into a probability density function and displays density distribution.

In many cases, since power needs vary according to the life pattern of people, the fluctuation velocity of a system state is relatively low. Therefore, the measurement cycle of the measuring device is set to 10 minutes to 30 minutes. However, recently, dispersed power sources using renewable energy such as wind power generation and solar power generation have been in widespread use, and the number of dispersed power sources connected to a power system and power generation amounts thereof tend to increase over the years. The power generation amount of the dispersed power sources greatly fluctuates in a short period of time following changes in the direction and force of wind, the amount of solar radiation, and the like. Therefore, when many dispersed power sources are interconnected to the power system, the fluctuation velocity of a state of the power system increases.

In the power system having such large fluctuations, the system state cannot be appropriately grasped through the measurement with a long cycle of about 10 minutes to 30 minutes. Many measurement values can be obtained when the measurement cycle in the measuring device is shortened. However, in that case, since the amount of data to be sent from the measuring device to the analysis support apparatus exponentially increases, it is necessary to substitute communication lines connecting the analysis support apparatus and the respective measuring devices disposed in the power system with higher speed and more expensive communication lines, and thus the cost increases.

The invention is contrived in view of the problems, and an object thereof is to provide a power system analysis support system in which the amount of data to be sent from a measuring device to an analysis support apparatus can be reduced, an analysis support apparatus for a power system, an analysis support method for a power system, and a measuring device for a power system.

Solution to Problem

In order to solve the problems, a power system analysis support system according to the invention is a power system analysis support system which supports analysis of a power system, including: a measuring device which performs measurement related to the power system; and an analysis support apparatus which is connected to the measuring device to communicate therewith, in which the measuring device includes a measuring unit which performs measurement related to the power system, a storage unit which stores measurement values measured by the measuring unit, a parameter generator which generates a predetermined parameter indicating a probability density function of the measurement value from the plurality of measurement values stored in the storage unit, and a communication unit which sends the predetermined parameter generated by the parameter generator to the analysis support apparatus, and the analysis support apparatus includes a communication unit which receives the predetermined parameter from the measuring device, and a probability density function generator which generates a probability density function of the measurement value from the received predetermined parameter.

Advantageous Effects of Invention

According to the invention, the measuring device can send a predetermined parameter indicating a probability density function of the measurement value to the analysis support apparatus, and the analysis support apparatus can generate the probability density function of the measurement value from the predetermined parameter. Accordingly, even in a case in which the number of times of the measurement of the measuring device is increased, the amount of data to be sent from the measuring device to the analysis support apparatus can be reduced, and the communication load can be reduced. Moreover, since the measuring device handles a part of the process of generating a probability density function from the plurality of measurement values, it is possible to reduce the processing load of the analysis support apparatus.

DESCRIPTION OF EMBODIMENTS

Hereinafter, embodiments of the invention will be described based on the drawings. A power system analysis support system according to this embodiment has: one or more measuring devices 1 disposed in a power system; and an analysis support apparatus 2 connected to the measuring device 1 via a communication line 3. The measuring device 1 generates measurement values and a predetermined parameter indicating a stay probability thereof, and sends the predetermined parameter to the analysis support apparatus 2. The analysis support apparatus 2 calculates a stay probability (probability density function) from the predetermined parameter. The analysis support apparatus 2 calculates, from the calculated stay probability, a measurement value range in which a probability with necessary accuracy is obtained.

As described above, the measuring device 1 of this embodiment converts a plurality of measurement values into a predetermined parameter such as frequency distribution or moment convertible into a probability density function. Accordingly, the amount of data to be sent from the measuring device 1 to the analysis support apparatus 2 can be reduced even when the number of measurement values per hour is increased by reducing a measurement time interval. Since it is possible to suppress communication traffic, it is not necessary to substitute the communication line 3 with an expensive high-speed communication line. Furthermore, since there is room in the amount of data to be sent through the communication line 3, the number of the measuring devices installed in the power system can also be increased.

First Example

Figure 1:
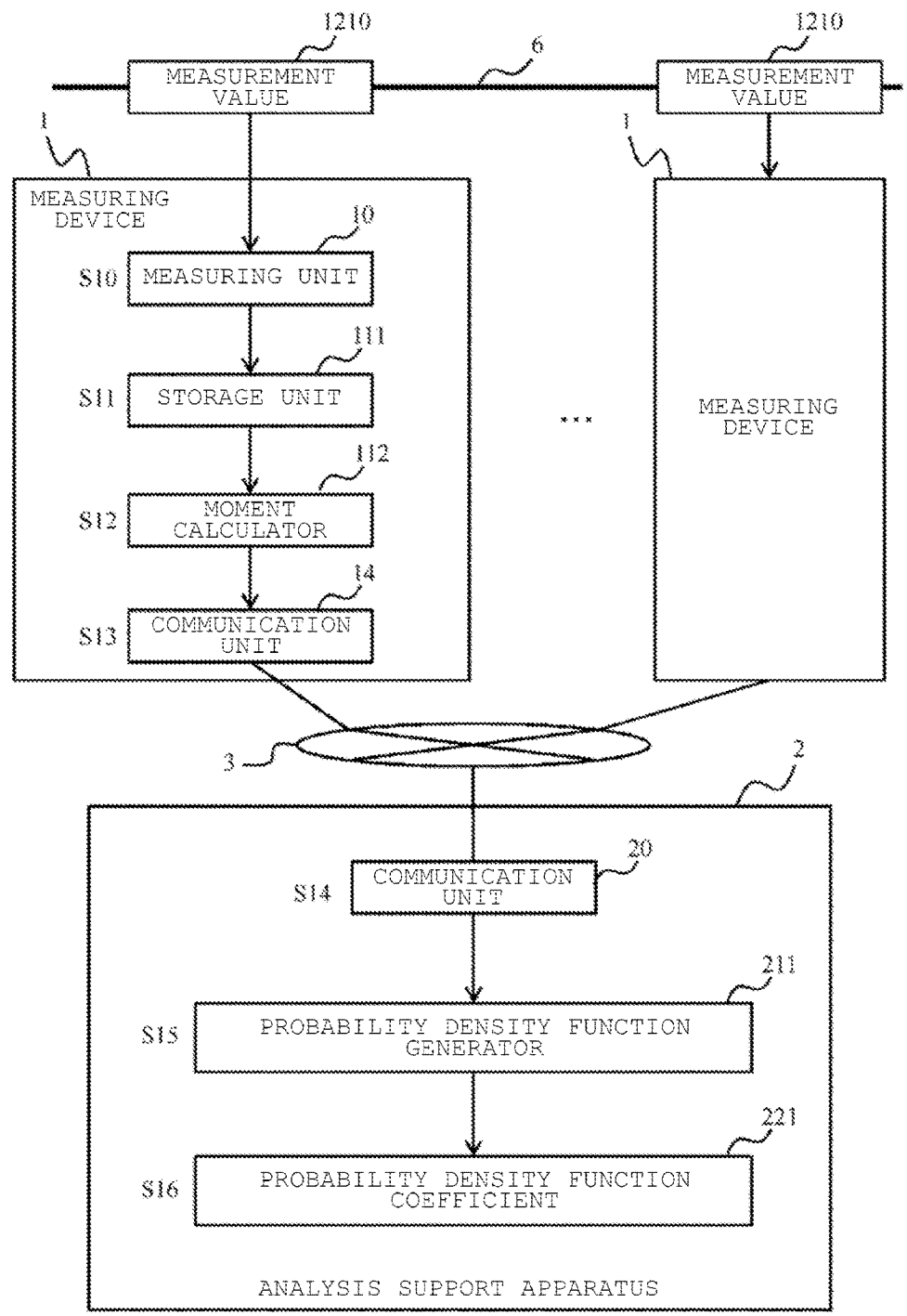
FIG. 1 is a diagram for illustrating a configuration of a power system analysis support system according to a first example.
Figure 2:
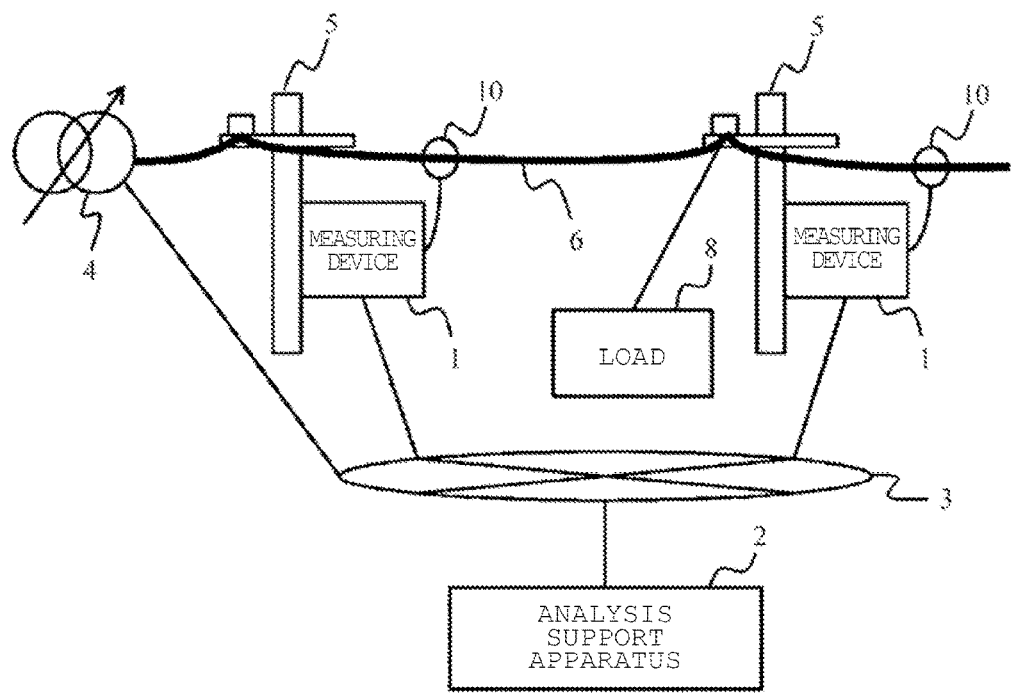
FIG. 2 is a configuration diagram of a power system.
Figure 3:
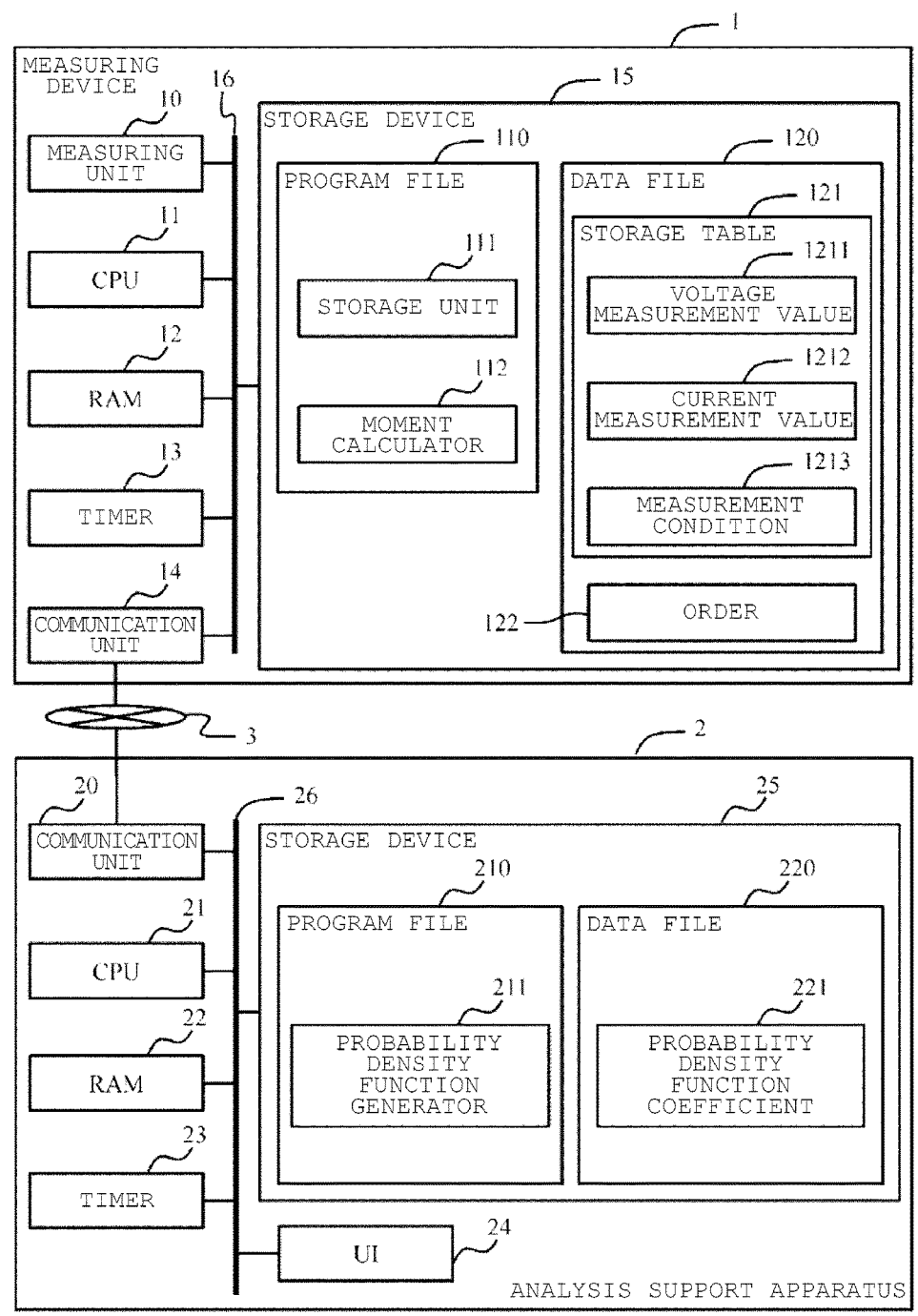
FIG. 3 is a configuration diagram for illustrating hardware configurations of a measuring device and an analysis support apparatus.

A first example will be described using FIGS. 1 to 3. FIG. 1 is a diagram for illustrating functional configurations of the measuring device 1 and the analysis support apparatus 2. FIG. 2 illustrates a configuration of a distribution system as a power system. FIG. 3 illustrates hardware configurations of the measuring device 1 and the analysis support apparatus 2. First, the relationship between the distribution system and the power system analysis support system will be described using FIG. 2.

A step voltage regulators (SVR) as an example of an "automatic voltage controller" is attached to a distribution line 6 in series. The SVR 4 controls a voltage value to be sent to the distribution line 6 by automatic tap switching. The distribution line 6 for supplying power to a load 8 of a consumer is attached to, for example, a support member such as a telegraph pole 5. In place of the air spinning method using the telegraph pole 5, the distribution line 6 may be buried in the ground.

One or more measuring devices 1 are installed in the middle of the distribution line 6. The measuring device 1 can be attached to the telegraph pole 5 as a support member. The measuring device 1, the analysis support apparatus 2, and the SVR 4 are connected to each other via the communication line 3 to make an inquiry about data therebetween. As will be described later, it is also possible to remotely rewrite order information 122 and the like stored in the measuring device 1 via the communication line 3.

The communication line 3 may be either a wired line or a wireless line. As the communication line 3, local area network (LAN), wide area network (WAN), Internet, power line communication (PLC), general packet radio service (GPRS), or the like can be used.

Hardware configurations of the measuring device 1 and the analysis support apparatus 2 will be described using FIG. 3. The measuring device 1 is provided with, for example, a measuring unit 10, a central processing unit (CPU) 11, a random access memory (RAM) 12, a timer 13, a communication unit 14, and a storage device 15, and these circuits 10 to 15 are connected to a bus 16.

The measuring unit 10 is a device which measures a value related to a state of the power system. The measuring unit 10 includes, for example, a sensor such as a voltage sensor or a current sensor connected to the distribution system, and an analog digital converter (ADC) which periodically reads a measurement value 1210 of the sensor and performs AD conversion. In this example, the AD converter has a direct memory access (DMA) function, and allows the measurement value 1210 to be periodically recorded in an internal register of the AD converter.

The CPU 11 of the measuring device 1 measures a time by the timer 13, and executes programs 111 and 112 in a program file 110 at a fixed time interval. The RAM 12 is a memory which temporarily stores measurement values, moments, intermediate result data of the calculation of a moment calculator 112, and the like.

The storage device 15 is configured as a non-volatile storage device such as a flash memory device or a hard disk drive, and stores the program file 110 and a data file 120.

In the program file 110, a predetermined computer program to be executed by the CPU 11 is stored. Examples of the predetermined computer program include a program for realizing a storage unit 111 which stores the measurement value 1210 and a program for realizing the moment calculator 112 which calculates a moment. The moment calculator 112 is an example of a "parameter generator". The moment to be described later is an example of the "predetermined parameter".

The data file 120 stores, for example, a storage table 121 and an order 122. The storage table 121 stores a voltage measurement value 1211, a current measurement value 1212, and a measurement condition 1213.

The voltage measurement value 1211, the current measurement value 1212, and the measurement condition 1213 have an array structure or a ring buffer structure. The storage unit 111 stores them in a place different from that for the voltage measurement value 1211, the current measurement value 1212, and the measurement condition 1213 acquired in the previous time. The storage table 121 have such a capacity that each of the data 1211, 1212, and 1213 can be stored for a predetermined time period (for example, 1 month). The order 122 of the probability density function will be described later.

A configuration of the analysis support apparatus 2 will be described. The analysis support apparatus 2 is provided with, for example, a communication unit 20, a CPU 21, a RAM 22, a timer 23, a user interface unit 24, and a storage device 25, and these circuits 20 to 25 are connected to a bus 26.

The CPU 21 of the analysis support apparatus 2 executes a predetermined computer program 211 in the program file 110 every time the communication unit 20 receives data 1211 to 12113 from the measuring device 1. The RAM 22 is a memory which temporarily stores reception data, a probability density function coefficient 221, and intermediate result data of the calculation of a probability density function generator 211.

The user interface unit 24 is an information input/output device for exchanging information with a user such a system manager. The user interface unit 24 has an information input device and an information output device which outputs information. Examples of the information input device include a keyboard, a mouse, a tablet, and a voice input device. Examples of the information output device include a display, a printer, and a voice synthesis device. The user interface unit 24 is configured as an information input/output terminal different from the analysis support apparatus 2, and the terminal and the analysis support apparatus 2 may be connected to communicate with each other.

The storage device 25 is configured as a non-volatile storage device such as a flash memory device or a hard disk drive. The storage device 25 stores a program file 210 and a data file 220.

In the program file 210, a predetermined computer program to be executed by the CPU 21 is stored. Examples of the predetermined computer program include a program for realizing the probability density function generator 211. In the data file 220, for example, a probability density function coefficient 221 is stored.

A processing flow of the power system analysis support system according to this example will be shown using FIG. 1. First, an operation of the measuring device 1 will be described.

The measuring unit 10 reads a voltage measurement value 1211 and a current measurement value 1212 with a cycle set in the DMA, and records them in the storage table 121 (Step S10). The activation cycle of the measuring unit 10 is set to be shorter than that of the storage unit 111. In this example, the activation cycle of the measuring unit 10 is set to, for example, 30 seconds.

Next, the storage unit 111 is activated with a cycle set in the timer 13 to store the current measurement value 1212 and the voltage measurement value 1211 stored in the internal register of the measuring unit 10 in the data file 120 (Step S11). The activation cycle of the storage unit 111 is set to be shorter than that of the moment calculator 112. In this example, the activation cycle of the storage unit 111 is set to, for example, 1 minute.

Next, the moment calculator 112 is activated with a cycle set in the timer 13. The activation cycle of the moment calculator 112 is set to be shorter than or the same as that of the communication unit 14 (activation cycle of moment calculator activation cycle of communication unit).

The moment calculator 112 calculates a center moment from the voltage and current measurement values (Step S12). For the calculation of the center moment, it is possible to use, for example, the center moment calculation formula in p. 107 of NPL 1. Specifically, a first-order moment $\mu$ and a second-order moment (dispersion) $\sigma^2$ can be respectively calculated through the following Formula 1 and Formula 2.

$$\mu = \int_{-\infty}^{\infty} xp(x)dx = \sum_{i=1}^{N} \frac{X_i}{N} \qquad \text{[Formula 1]}$$

$$\sigma^2 = \int_{-\infty}^{\infty} (x-\mu)^2 p(x)dx = \sum_{i=1}^{N} \frac{(X_i - \mu)^2}{N} \qquad \text{[Formula 2]}$$

$p(x)$ is a probability density function, N is the number of measurement values, and $X_i$ is an i-th measurement value. An n-order moment $m_n$ of third or higher order can be calculated as in the following Formula 3.

$$m_n = \int_{-\infty}^{\infty} (x-\mu)^n p(x)dx = \sum_{i=1}^{N} \frac{(X_i - \mu)^n}{N} \qquad \text{[Formula 3]}$$

A specific calculation procedure will be described using a case of voltage as an example. In this example, the storage unit 111 stores the measurement value every 1 minute, and the moment calculator 112 performs moment calculation every 30 minutes. Therefore, the value of N is 30 in both of the case of voltage and the case of current. First, voltage measurement values $X_1, X_2, \ldots X_{30}$ and N=30 are substituted into Formula 1 to calculate the first-order moment $\mu$. Next, the voltage measurement values, N=30, and the first-order moment $\mu$ calculated in the above description are substituted into Formula 2 to calculate the second-order moment (dispersion) $\sigma^2$.

Next, the order 122 is read to obtain the maximum order of the center moment to be calculated. In a case in which the maximum order is 2 or lower, the moment calculator 112 is quitted. In a case in which the maximum order is 3 or higher, the voltage measurement values, N=30, and the order n=3 are substituted into Formula 3 to calculate a third-order moment $m_3$. A fourth-order moment $m_4$ to a maximum-order moment are calculated in order.

Finally, the moment calculator 112 activates the communication unit 14. The communication unit 14 sends, to the analysis support apparatus 2, n pieces of data from the first-order moment to the maximum-order moment calculated by the moment calculator 112 (Step S13).

Next, an operation of the analysis support apparatus 2 will be described. First, the communication unit 20 receives, from the measuring device 1, the first-order to n-order moments ($\mu, \sigma^2, m_3, m_4, \ldots m_n$) of each of the current and the voltage (Step S14).

The probability density function generator 211 calculates an approximation formula of each probability density function from each of the moments of the current and the voltage (Step S15). For the calculation of the approximation formula of the probability density function, it is possible to use, for example, the Gram-Charlier series in p. 117 of NPL 1. When using this series, a probability density function $p(x)$ is calculated as in the following Formulae 4 to 10 using a normal distribution $\varphi$ and a derivative thereof.

$$p(x) = c_0 \varphi(x) + \frac{C_1}{1!}\varphi'(x) + \frac{C_2}{2!}\varphi^{(2)}(x) + \ldots + \frac{C_3}{n!}\varphi^{(n)}(x) \qquad \text{[Formula 4]}$$

$$C_0 = 1 \quad \text{[Formula 5]}$$

$$C_1 = C_2 = 0 \quad \text{[Formula 6]}$$

$$C_3 = -m_3/\delta^3 \quad \text{[Formula 7]}$$

$$C_4 = m_4/\delta^4 - 3 \quad \text{[Formula 8]}$$

$$C_5 = -m_5/\delta^5 + 10m_3/\delta^3 \quad \text{[Formula 9]}$$

$$C_6 = m_6/\delta^6 - 15m_4/\delta^4 + 30 \quad \text{[Formula 10]}$$

Formulae 4 to 10 show the reception of up to a sixth-order moment. There is also a formula for calculating a coefficient Cn of Formula 4 using a seventh- or higher-order moment, and in that case, the accuracy of the probability density function p(x) can be further improved.

Finally, the probability density function generator 211 stores the calculated coefficients C0 to Cn of the probability density function as the probability density function coefficient 221 of the data file 220 (Step S16).

In a case in which the analysis support apparatus 2 displays a graph p(x) of the probability density function of the voltage on a display screen of the user interface unit 24, p (x) may be obtained by substituting the probability density function coefficient 221 of the data file 220 into Formula 4, and by substituting a value in the voltage range (for example, 0 V to 12,000 V) of the distribution line 6 for x.

In a case in which the analysis support apparatus 2 needs moments of active power and reactive power, the storage unit 111 of the measuring device 1 stores a phase angle that is a phase difference between the voltage and the current in the storage table 121. After the moment calculator 112 calculates the active current and the reactive current from the voltage, the current, and the phase, center moments of the active current and the reactive current may be calculated using Formulae 1, 2, and 3. As in the case of the moments of the current and the voltage, information of the center moments of the active power and the reactive power is sent from the communication unit 14 to the analysis support apparatus 2.

According to this example configured as described above, in the measuring device 1, a predetermined parameter such as frequency distribution or moment convertible into a probability density function is generated from a plurality of measurement values, and the generated parameter is sent to the analysis support apparatus 2. Accordingly, the amount of data to be sent from the measuring device 1 to the analysis support apparatus 2 can be reduced in comparison to a case in which the measurement values themselves are sent from the measuring device 1 to the analysis support apparatus 2.

As a result, in this example, even in a case in which the cycle (measurement cycle) of the measuring unit 10 of the measuring device 1 is shortened and the number of measurement values per hour is increased, it is possible to suppress an increase in the amount of data (communication traffic) flowing through the communication line 3. Therefore, according to this example, it is possible to analyze the state of the power system using many measurement values with high reliability without substituting the communication line 3 with an expensive high-speed communication line.

Furthermore, in this example, since a predetermined parameter (frequency distribution or moment) convertible into a probability density function is generated in the measuring device 1, the analysis support apparatus 2 can easily calculate a probability density function using the predetermined parameter. Accordingly, it is possible to reduce the processing load of the analysis support apparatus 2 which processes data from the plurality of measuring devices 1.

Second Example

A second example will be described using FIG. 4. Since the following examples including this example are modified examples of the first example, differences thereof from the first example will be mainly described. In this example, probability density functions based only on the voltage fluctuation and the current fluctuation generated by a consumer load 8 are calculated without being influenced by the operation of a SVR 4 of the upstream.

As illustrated in FIG. 2, the SVR 4 may be interconnected to the system upstream of a measuring device 1. The SVR 4 is a transformer capable of switching a transformation ratio in steps with a tap. In a power company, tap switching is performed in order to appropriately maintain the voltage of a distribution line 6. Tap numbers are given to the tap. The larger the number, the higher the transformation ratio and the higher the secondary voltage. There are 10- to 20-step taps, and in this example, the tap is in 10 steps.

In a case of switching from Tap No. 1 to Tap No. 2 of the SVR 4, the secondary voltage thereof is reduced. At this time, the voltage reduced by the SVR 4 is observed also by the measuring device 1 at the downstream of the SVR 4. On the other hand, in a case of switching from Tap No. 2 to Tap No. 1, the secondary voltage of the SVR 4 is increased, and the increase in the voltage is detected also by the measuring device 1 at the downstream. When the fluctuation generated by the above switching is included in the probability density function, the fluctuation generated by the load 8 of the system or the generator cannot be correctly analyzed.

In this example, a probability density function is separately provided for each tap number, and is displayed in an analysis support apparatus 2. In FIG. 4, the load 8 of the consumer is omitted, but as illustrated in FIG. 2 and FIG. 5 to be described later, the load 8 is connected to the distribution line 6 at the downstream of the measuring device 1.

Hereinafter, the measuring device 1 of this example will be described. First, a measuring unit 10 is activated by a DMA (Step S10A). A storage unit 111 is activated with a cycle set in a timer 13 (Step S11A).

The storage unit 111 stores measurement values in a storage table 121 from an internal register of the DMA of the measuring unit 10, and then inquires the SVR 4 about a tap number using a communication unit 14. The SVR 4 returns the current tap number to the measuring device 1 through a communication line 3 and the communication unit 14.

Figure 4:
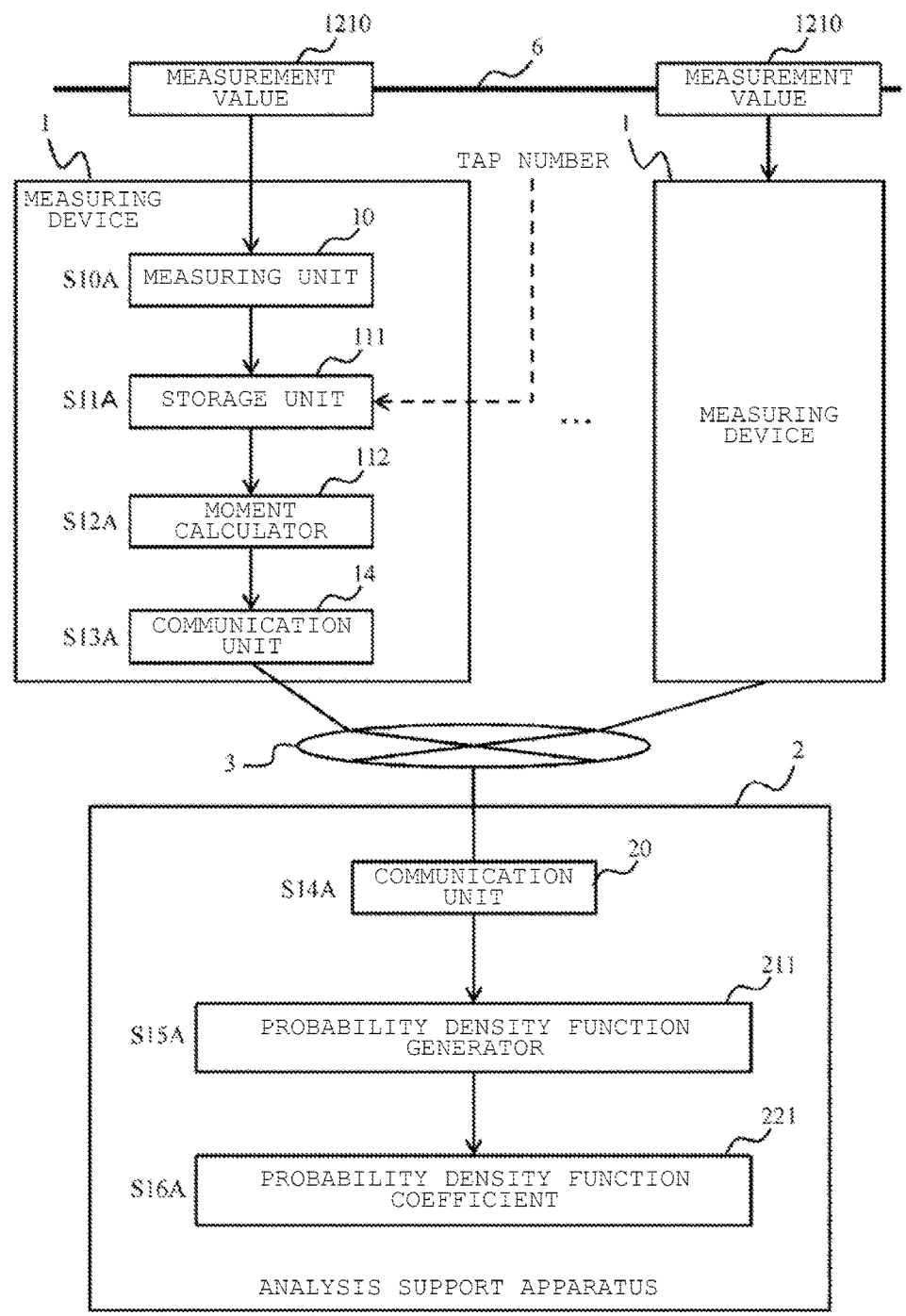
FIG. 4 is a diagram for illustrating a configuration of a power system analysis support system according to a second example.
Figure 5:
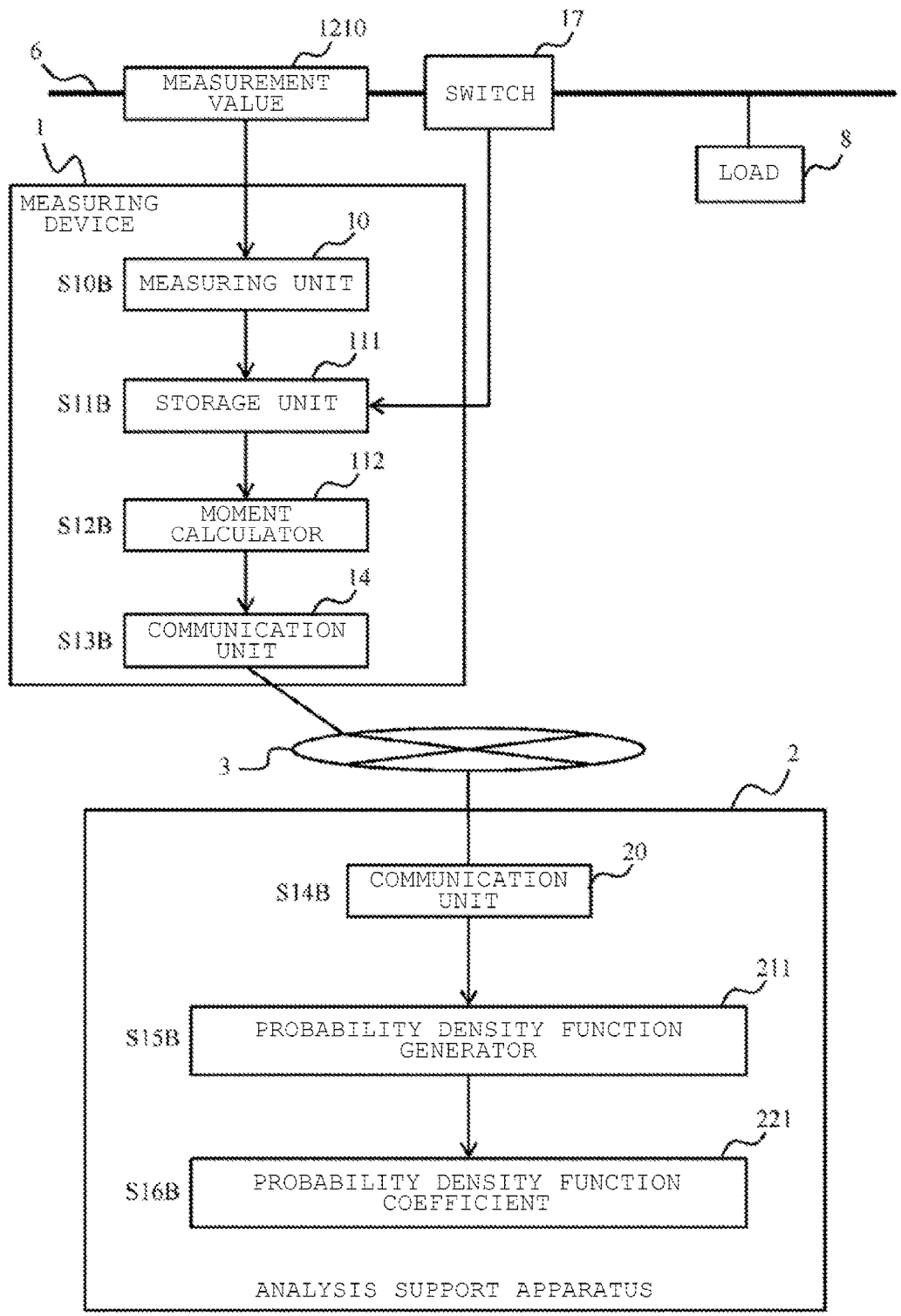
FIG. 5 is a diagram for illustrating a configuration of a power system analysis support system according to a third example.

Although FIG. 4 illustrates as if the storage unit 111 directly acquires the tap number, actually, the tap number is acquired from the SVR 4 by communication with the SVR 4 using the communication line 3 and the communication unit 14.

The storage unit 111 stores the tap number in a measurement condition 1213. Next, a moment calculator 112 is activated with a cycle set in the timer 13 (Step S12A). The moment calculator 112 calculates a center moment for each measurement condition 1213 from the voltage and current measurement values.

For example, a case is assumed in which the measurement is performed at an interval of 1 minute and a center moment is calculated at an interval of 30 minutes as in the first example. In a case in which measurement values are obtained for 10 minutes in a case of Tap No. 1, and measurement values are obtained for 20 minutes in a case of Tap No. 2, the measurement values for 10 minutes in the case of Tap No. 1 and N=10 are substituted into Formulae 1, 2, and 3 to calculate the center moment in the case of Tap No. 1.

Similarly, the measurement values for 20 minutes in the case of Tap No. 2 and N=20 are substituted into Formulae 1, 2, and 3 to calculate the center moment in the case of Tap No. 2. Finally, the moment calculator 112 activates the communication unit 14 (Step S13A).

The communication unit 14 sends the center moment to the analysis support apparatus 2 for each tap number. For example, at the beginning, the tap number and the center moment in the case of Tap No. 1 are sent. Next, the tap number and the center moment in the case of Tap No. 2 are sent.

The analysis support apparatus 2 of this example will be described. A configuration of the analysis support apparatus 2 is the same as that in the first example. However, unlike in the first example, probability density function coefficients 221 are provided to correspond to the number of the tap numbers of the SVR 4.

When a communication unit 20 receives the tap number and the center moment (Step S14A), coefficients $C_0$ to $C_n$ of an approximation formula of a probability density function p(x) of the tap number are calculated using Formulae 4 to 10 (Step S15A) as in the first example. These are stored as the probability density function coefficient 221 of the tap number corresponding thereto (Step S16A).

This example configured as described above has the same effects as those of the first example. Furthermore, according to this example, it is possible to calculate the probability density function, based only on the voltage fluctuation and the current fluctuation generated by the consumer load 8 without being influenced by the tap switching operation of the SVR 4. As a result, it is possible to accurately analyze the state of the power system.

Third Example

A third example will be described using FIG. 5. In this example, a probability density function based only on the voltage fluctuation and the current fluctuation generated by a load 8 of a consumer is calculated without being influenced by the operation of a switch of a measuring device 1.

The measuring device 1 has a switch 17. The switch 17 is interconnected to a distribution line 6 in series. In a power company, the switch 17 is switched in order to separate an accident point when an accident such as ground fault occurs, or to reduce distribution loss.

In a case in which the switch 17 is switched on, the load 8 is interconnected to the downstream of a distribution system. Accordingly, the voltage in the measuring device 1 is reduced by the power consumption of the load 8.

When the switch 17 is switched off, the load 8 at the downstream of the measuring device 1 is separated from the distribution line 6, and thus the voltage of the measuring device 1 is rapidly increased. In addition, in a case in which a generator is interconnected to the downstream, the voltage is rapidly reduced when the switch 17 is switched on from off. When the fluctuation generated by this switching is included in the probability density function, the fluctuation generated by the load 8 of the system or the generator cannot be correctly analyzed.

In this example, a probability density function is separately provided every ON and OFF of the switch 17, and is displayed in an analysis support apparatus 2. An example in which a probability density function in a case in which the switch 17 is switched on and a probability density function in a case in which the switch 17 is switched of f are separately displayed in the analysis support apparatus 2 will be described. In FIG. 5, only one measuring device 1 is shown in order to show the switch 17 and the load 8.

A measuring unit 10 is activated by a DMA (Step S10B). Since the operation thereof is the same as in the first example, it will be omitted. Next, a storage unit 111 is activated with a cycle set in a timer 13 (Step S11B). The storage unit 111 stores measurement values in a storage table 121 from an internal register of the DMA of the measuring unit 10, and then inquires a switch 17 about a state of the switch (ON or OFF). The switch 17 returns the switch state to the measuring device 1. The storage unit 111 stores the state of the switch 17 in a measurement condition 1213.

Next, a moment calculator 112 is activated with a cycle set in the timer 13 (Step S12B). The moment calculator 112 calculates a center moment for each measurement condition 1213 from the voltage and current measurement values.

For example, the measurement is performed at an interval of 1 minute and a center moment is calculated at an interval of 30 minutes as in the first example. In this case, a case is assumed in which measurement values are obtained for 10 minutes in a case in which the switch 17 is switched on, and measurement values are obtained for 20 minutes in a case in which the switch 17 is switched off. The measurement values for 10 minutes in the case in which the switch 17 is switched on and N=10 are substituted into Formulae 1, 2, and 3 to calculate the center moment in the case in which the switch 17 is switched on. In addition, the measurement values for 20 minutes in the case in which the switch 17 is switched off and N=20 are substituted into Formulae 1, 2, and 3 to calculate the center moment in the case in which the switch 17 is switched off.

Finally, the moment calculator 112 activates the communication unit 14 (Step S13B). The communication unit 14 sends the center moment to the analysis support apparatus 2 every ON and OFF of the switch 17. For example, at the beginning, the switch state (ON) and the center moment when the switch is switched on are sent. Next, the switch state (OFF) and the center moment when the switch is switched off are sent.

The analysis support apparatus 2 of this example will be described. A configuration of the analysis support apparatus 2 is the same as that in FIG. 4. However, unlike in the first example, two sets of probability density function coefficients 221 for switch-on and for switch-off are provided. When the communication unit 20 receives the switch state and the center moment (Step 14B), coefficients $C_0$ to $C_n$ of an approximation formula of a probability density function p(x) thereof are calculated using Formulae 4 to 10 (Step S15B) as in the first example. These are stored as the probability density function coefficient 221 of the switch state corresponding thereto (Step S16B).

This example configured as described above has the same effects as those of the first example. Furthermore, according to this example, it is possible to calculate the probability density function based only on the voltage fluctuation and the current fluctuation generated by the consumer load 8 without being influenced by the open/close state of the switch 17. As a result, it is possible to accurately analyze the state of the power system.

Fourth Example

Figure 6:
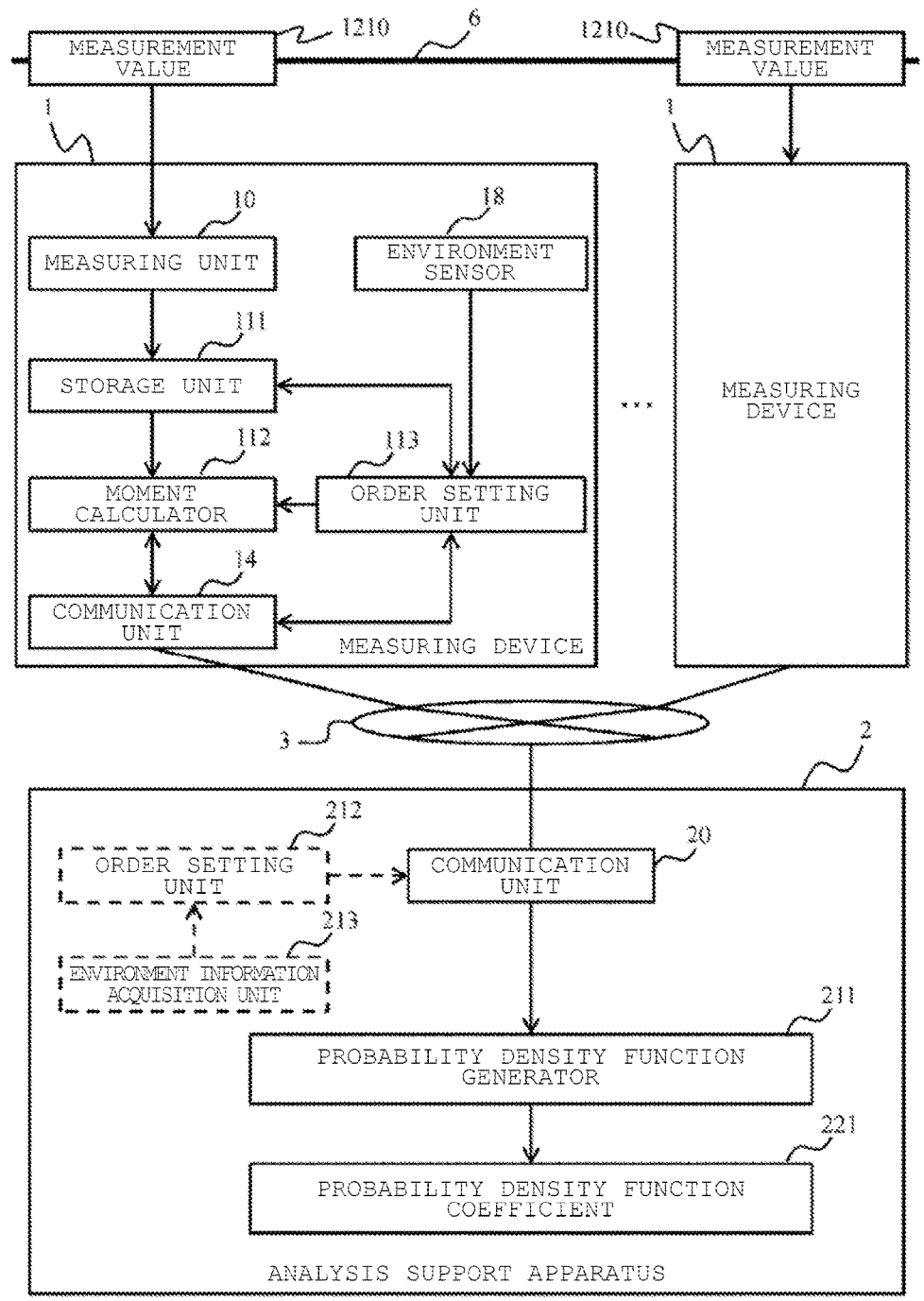
FIG. 6 is a diagram for illustrating configuration of a power system analysis support system according to a fourth example.
Figure 7:
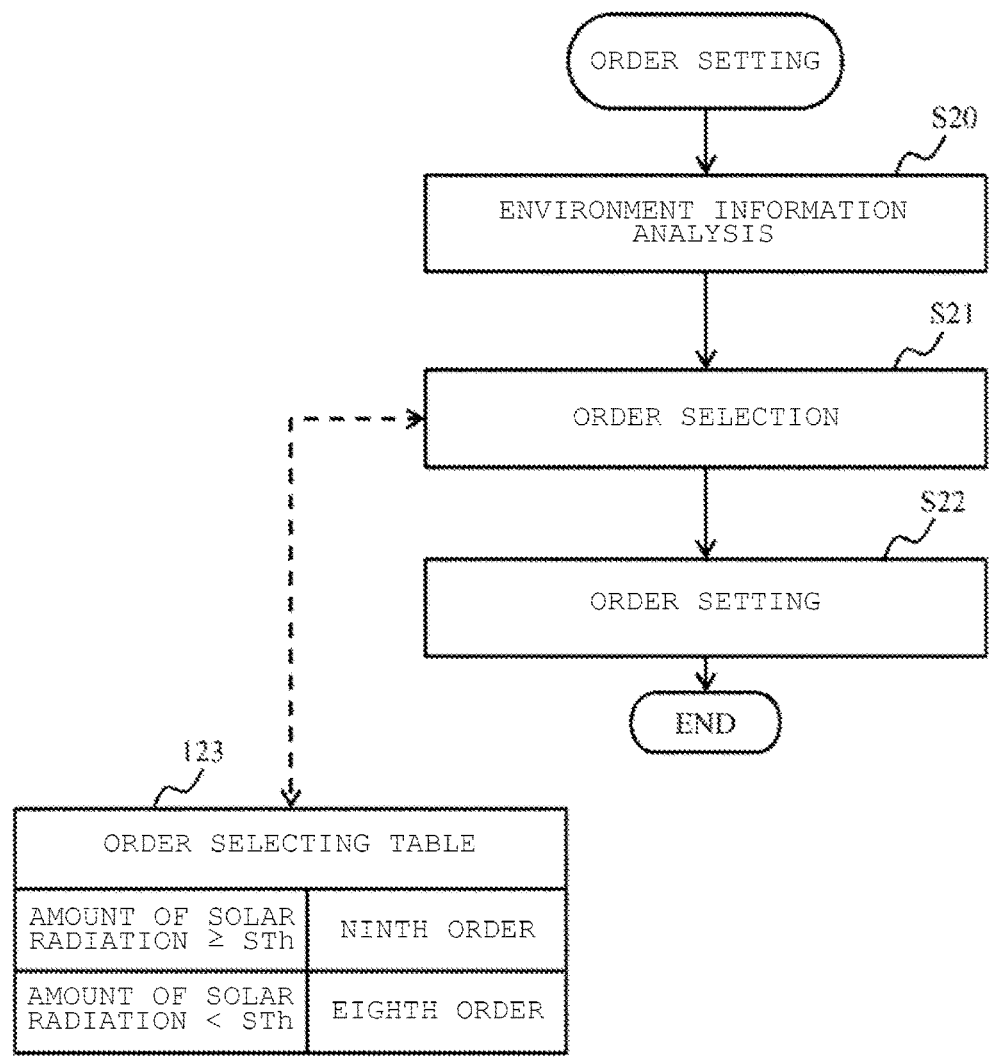
FIG. 7 is a flowchart of an order setting process.

A fourth example will be described using FIGS. 6 and 7. In this example, the maximum order of a moment to be used to calculate a probability density function is changed according to the state of a power system. FIG. 6 illustrates a functional configuration of a power system analysis support system, and FIG. 7 illustrates a flowchart of an order setting process.

The order change configuration can be provided in any one or both of a measuring device 1 and an analysis support apparatus 2. First, a case in which the configuration is provided in the measuring device 1 will be described.

The measuring device 1 is provided with an order setting unit 113 and an environment sensor 18 in addition to the configuration described in the first example. The environment sensor 18 is configured as a physical device and is connected to a bus 16. The environment sensor 18 detects information related to the environment of a power system and sends the information to the order setting unit 113. The information related to the environment of the power system is, for example, information such as a solar radiation amount and a wind speed having an influence on the output of dispersed power sources interconnected to the power system. Here, a solar radiation amount will be used for description as an example of the information related to the environment.

The order setting unit 113 determines the maximum order based on the information from the environment sensor 18, and sets it in a moment calculator 112. An example of the order setting process will be described using FIG. 7. The order setting unit 113 analyzes the information from the environment sensor 18 (Step S20), and selects one order according to the environment of the power system with reference to an order selecting table 123 provided previously (Step S21). The order setting unit 113 sets the selected order in the moment calculator 112 (Step S22).

The order selecting table 123 is stored in a data file 120 and specifies the maximum order of the moment with the relationship between the solar radiation amount and the threshold. In a case in which the solar radiation amount is equal to or greater than a predetermined threshold STh (solar radiation amount STh), the ninth order is selected as the maximum order. In a case in which the solar radiation amount is less than the predetermined threshold STh (solar radiation amount <STh), the eighth order is selected as the maximum order.

The larger the solar radiation amount, the larger the power generation amount of a solar power generation apparatus interconnected to the power system, and as a result, the voltage value of the power system increases. In a case in which the voltage value is high, the probability density function can be more accurately calculated with a high maximum-order moment. Accordingly, in this example, as described above, the ninth order is selected in a case in which the solar radiation amount is equal to or greater than the threshold STh, and the eighth order is selected in a case in which the solar radiation amount is less than the threshold STh.

As illustrated in FIG. 6, the maximum order calculated by a moment calculator 112 may be determined in the analysis support apparatus 2, and the measuring device 1 may be notified of the determined maximum order. In this case, in the analysis support apparatus 2, an order setting unit 212 and an environment information acquisition unit 213 are provided.

The environment information acquisition unit 213 acquires information (for example, solar radiation amount and weather) related to the environment of the power system from, for example, a server which distributes weather information, and transmits the acquired information to the order setting unit 212. The order setting unit 212 selects the order according to the environment of the power system with reference to the order selecting table shown in FIG. 7 based on the environment information. Since the analysis support apparatus 2 manages a plurality of measuring devices 1, the order is selected for each measuring device 1. The analysis support apparatus 2 sends the selected order to each measuring device 1, and sets the selected order in the moment calculator 112.

This example configured as described above has the same effects as those of the first example. Furthermore, in this example, the maximum order as a calculation target of the moment to be used in the calculation of the probability density function is set according to the environment of the power system, and thus the probability density function can be more accurately calculated.

The invention is not limited to the above-described examples. It is possible for those skilled in the art to make various additions and modifications within the scope of the invention. For example, the case in which the examples are applied to the distribution system as the power system has been described, but the invention is not limited thereto. The examples can also be applied to a transmission system. In this case, the measuring device 1 may be attached to a transmission line.

The measuring device 1 described in this example can be expressed, for example, as follows: "a measuring device for a power system which performs measurement related to the power system, including: a measuring unit which performs measurement related to the power system; a storage unit which stores measurement values measured by the measuring unit; a parameter generator which generates a predetermined parameter to be used to calculate a probability density function of the measurement value from a predetermined number of the measurement values stored in the storage unit; and a communication unit which outputs the predetermined parameter generated by the parameter generator.

REFERENCE SIGNS LIST

1: MEASURING DEVICE
2: ANALYSIS SUPPORT APPARATUS
3: COMMUNICATION LINE
4: SVR
6: DISTRIBUTION LINE
10: MEASURING UNIT
14: COMMUNICATION UNIT
111: STORAGE UNIT
112: MOMENT CALCULATOR
20: COMMUNICATION UNIT
211: PROBABILITY DENSITY FUNCTION GENERATOR

The invention claimed is:
1. A power system analysis support system which supports analysis of a power system, comprising:
a measuring device which performs measurement related to the power system; and
an analysis support apparatus which is connected to the measuring device to communicate therewith,
wherein the measuring device includes
a measuring unit which performs measurement related to the power system,
a storage unit which stores measurement values measured by the measuring unit,
a parameter generator which generates a predetermined parameter indicating a probability density function of the measurement value from the plurality of measurement values stored in the storage unit, and a communication unit which sends the predetermined parameter generated by the parameter generator to the analysis support apparatus, and the analysis support apparatus includes a communication unit which receives the predetermined parameter from the measuring device, and a probability density function generator which generates a probability density function of the measurement value from the received predetermined parameter.

2. The power system analysis support system according to claim 1, wherein the measurement value includes one or more of a voltage, a current, active power, and reactive power of the power system.

3. The power system analysis support system according to claim 2, wherein the storage unit stores the measurement values and measurement conditions in association with each other.

4. The power system analysis support system according to claim 3, wherein the power system is provided with an automatic voltage controller capable of switching a transformation ratio with a tap, and the storage unit stores, as the measurement condition, a tap position of the automatic voltage controller in association with the measurement value.

5. The power system analysis support system according to claim 3, wherein the power system is provided with a switch for separating a part of the power system, and the storage unit stores, as the measurement condition, a state of the switch in association with the measurement value.

6. The power system analysis support system according to claim 3, wherein the parameter generator generates a first-order center moment, a second-order center moment, and a third- or higher-order center moment as the predetermined moment.

7. The power system analysis support system according to claim 6, wherein the parameter generator can change the maximum order of a center moment generated as the predetermined parameter.

8. The power system analysis support system according to claim 7, further comprising:

an order setting unit which sets the maximum order according to a measurement environment in the parameter generator.

9. An analysis support apparatus which supports analysis of a power system, comprising:

a communication unit which acquires data from a measuring device which performs measurement related to a power system; and a computing unit which analyzes the data acquired by the communication unit, wherein the measuring device performs measurement related to the power system, stores measurement values, and generates a predetermined parameter indicating a probability density function of the measurement value from the stored plurality of measurement values, and the computing unit generates a probability density function of the measurement value from the predetermined parameter acquired from the measuring device, and calculates and stores a coefficient of the probability density function.

10. An analysis support method for a power system for supporting analysis of a power system using an analysis support apparatus, wherein the analysis support apparatus includes a communication unit which acquires data from a measuring device which performs measurement related to the power system, and a computing unit which analyzes the data acquired by the communication unit, the measuring device performs measurement related to the power system, stores measurement values, and generates, as the data, a predetermined parameter indicating a probability density function of the measurement value from the stored plurality of measurement values, and the analysis support apparatus acquires the predetermined parameter from the measuring device, generates a probability density function of the measurement value from the acquired predetermined parameter, and calculates and stores a coefficient of the probability density function.

* * * * *